United States Patent [19]

Iwasaki et al.

[11] 4,188,551
[45] Feb. 12, 1980

[54] AMPLIFIER CIRCUIT HAVING PHOTOELECTRIC CONVERTER

[75] Inventors: Takashiroh Iwasaki, Tokyo; Jun-ichi Mameda, Kodaira, both of Japan

[73] Assignee: Hitachi, Ltd., Japan

[21] Appl. No.: 920,248

[22] Filed: Jun. 29, 1978

[30] Foreign Application Priority Data

Jul. 29, 1977 [JP] Japan .................................. 52/90327

[51] Int. Cl.² ............................................. H01J 39/12
[52] U.S. Cl. .............................. 307/311; 250/214 A; 354/38
[58] Field of Search ............... 330/59, 308; 307/311; 250/214 A, 214 C, 214 P, 214 RC; 354/24, 30, 38

[56] References Cited
U.S. PATENT DOCUMENTS

3,814,944  6/1974  Berger ............................. 307/311 X
4,076,977  2/1978  Tsunekawa et al. ............ 307/311 X Primary Examiner—James B. Mullins
Attorney, Agent, or Firm—Craig and Antonelli

[57] ABSTRACT

A photometric amplifier circuit, having a photocurrent converting element connected between a pair of inverting and noninverting input terminals of a differential amplifier, for amplifying an electric signal responsive to the quantity of light, is characterized in that a differentiating circuit is connected between the inverting input terminal of the differential amplifier and a power supply to thereby prevent the differential amplifier from producing an undesired latch output when the power is supplied from the power supply, with the result that, after this power is supplied, a normal amplifying operation is capable of being obtained at an earlier time. This invention is particularly adapted for an automatic exposure control system for cameras to precisely control the exposure of the camera.

10 Claims, 7 Drawing Figures

AMPLIFIER CIRCUIT HAVING PHOTOELECTRIC CONVERTER

BACKGROUND OF THE INVENTION

This invention relates to a photometric amplifier circuit for amplifying an electric signal responsive to the quantity of light and, more particularly, to a photometric amplifier circuit adapted for exposure measurement in cameras.

In a photometric amplifier circuit of a high input impedance having a photo-current converting element connected between the inverting and noninverting input terminals of a differential or operational amplifier for amplifying an electric signal responsive to the quantity of light, a PN junction diode to be used as the photo-current converting element, using a semiconductor such as silicon, gallium arsenide, gallium arsenide phosphide, etc. exhibits a high internal resistance at times of low illumination or at times of little light quantity and, accordingly, forms a large time constant circuit with the high internal resistance and junction capacity of the diode itself. Generally, a negative feedback circuit is connected between the output terminal and the inverting input terminal of the differential amplifier. Accordingly, the potential of the noninverting input terminal of the differential amplifier generally tends to be increased in absolute value with respect to that of the inverting input terminal thereof in the transient state when power is supplied from a power supply due to the effects of the aforesaid time constant and negative feedback circuits. This potential applies an undesired accumulated charge to the photo-current converting element and latches up the output of the differential amplifier to a certain undesired value for some time after the power is supplied from the power supply. As a result, the photometric amplifier circuit does not amplify the detected current indicative of a low quantity of light and does not operate normally until this accumulated charge is removed from the converting element. That is, it lengthens the stand-by time from the time the power is supplied by the power supply to the converting element to the time the photometric amplifies amplifier normally. Such a latchup phenomenon occurs when the potential of the noninverting input terminal of the differential amplifier becomes higher than that of the inverting input terminal thereof when the power is supplied from the power supply, because of certain causes in addition to the aforementioned effects of the negative feedback circuit.

This latch-up phenomenon lengthens the stand-by time of the differential amplifier. When the photometric amplifier circuit amplifies a particularly low quantity of photo-current to control an optical instrument such as a camera by the output signal therefrom, the phenomenon lowers the performance of the optical instrument or makes precise control of the optical instrument impossible. In particular, in the automatic electronic exposure control of a camera, it becomes impossible to accomplish photometric control immediately after the power is supplied from the power supply to the photometric circuit by pressing a release button of the camera. This detracts from camera performance.

In order to better understand this problem, it will be described regarding an example of a photometric amplifier circuit according to the prior art shown in FIG. 1.

In FIG. 1, reference numeral 1 indicates a differential amplifier which has inverting and noninverting input terminals (−) and (+) and an output terminal (OUT). Reference characters Rf and Rs are resistors for forming the negative feedback circuit of the differential amplifier 1. PC indicates a PN junction photo-current converting semiconductor (photo-diode) inserted between a pair of input terminals of the differential amplifier 1. LD is a PN junction semiconductor diode for logarithmically compressing the current of the photo-current converting element PC. Reference numeral 2 is a standard voltage generating circuit for applying a standard voltage to the semiconductor diode LD. 3 is a DC power supply. S is a power switch for supplying the power from the power supply 3. The photodiode PC exhibits a high resistance in this circuit when illuminated by a low quantity of light. The equivalent circuit of this circuit has, as shown in FIG. 3, a photocurrent source Id, a PN junction capacity Cd, and a high resistance Rd.

If the potential of the noninverting input terminal (+) of the differential amplifier 1 becomes higher in absolute value then that of the inverting terminal (−) thereof when the power switch S is closed, the output voltage OUTPUT of the output terminal OUT of the differential amplifier 1 is latched up to an undesired output voltage exceeding a normal output voltage Vs corresponding to a low quantity of light for the time $t_1$ when it becomes the normal output voltage Vs until it decreases from a high output voltage Vh along a discharging time constant circuit and stabilizes to the voltage Vs, as shown by a curve $l_1$ in FIG. 2. The standby time is lengthened to $t_1$ in such a photometric amplifier circuit. The differential amplifier 1 amplifies the voltage difference applied between both the input terminals thereof by the gain thereof as it is, as indicated by the broken lines. Since the output voltage cannot, however, become higher than the power voltage Vcc, it is latched up to the upper limit value Vh of the output voltage of the differential amplifier 1.

To shorten the long stand-by time, one approach that has been considered is to accelerate the discharging of the accumulated charge of the photodiode PC by inserting the PN junction semiconductor diode BD so as to provide a bias opposite to the generated standard voltage of the standard voltage generating circuit 2 and by clamping the voltage at the noninverting input terminal of the differential amplifier 1 to the standard voltage when the power is supplied from the power supply. However, the stand-by time becomes as designated at $t_2$ even by this method, as indicated by a curve $l_2$ in FIG. 2. Thus, the latch-up phenomenon of the amplifier circuit cannot be completely eliminated.

SUMMARY OF THE INVENTION

It is, therefore, an object of the present invention to provide a photometric amplifier circuit which prevents the latch-up phenomenon of the output signal therefrom from occurring when the power is supplied from a power supply.

The present invention contemplates transiently supplying a certain voltage to the inverting input terminal of the differential amplifier such as a differentiating circuit when the power is supplied from the power supply to thereby forcibly invert the amplified output so as to discharge the accumulated charge of a photo-current converting element.

DETAILED DESCRIPTION OF THE PREFERRED EMBODIMENTS

Figure 1:
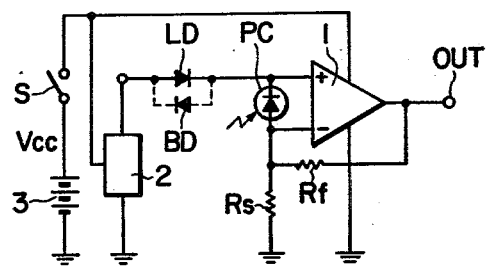
FIG. 1 is a circuit diagram of a photometric amplifier circuit according to the prior art.
Figure 2:
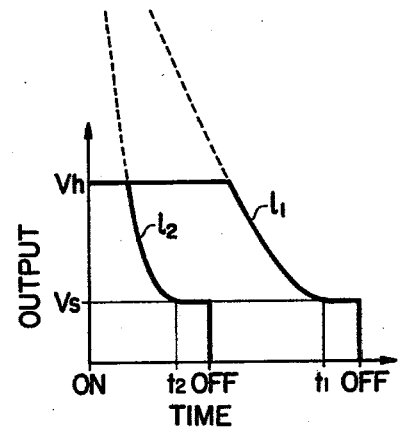
FIG. 2 is an electric characteristic chart showing the relationship between time and the output of the circuit in FIG. 1.
Figure 3:
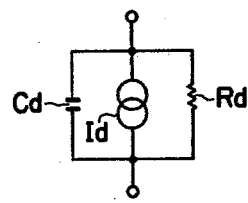
FIG. 3 is an equivalent circuit diagram of a photocurrent converting element of the circuit in FIG. 1.
Figure 4:
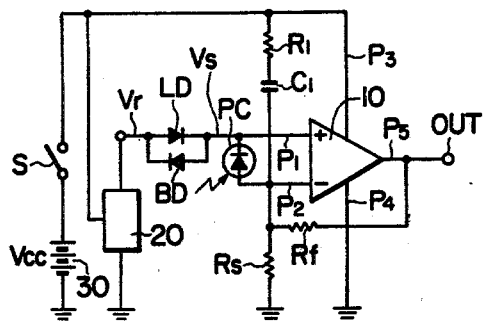
FIG. 4 is a circuit diagram of a photometric amplifier circuit constructed according to the present invention.

FIG. 4 shows one preferred embodiment of the photometric amplifier circuit according to the present invention.

In FIG. 4, reference numeral 10 indicates a differential amplifier, which has noninverting and inverting input terminals $P_1$ (+) and $P_2$ (−), a power supply terminal $P_3$, ground terminal $P_4$, and output terminal $P_5$. An example of the concrete configuration of the differential amplifier 10 is shown in FIG. 5.

Figure 5:
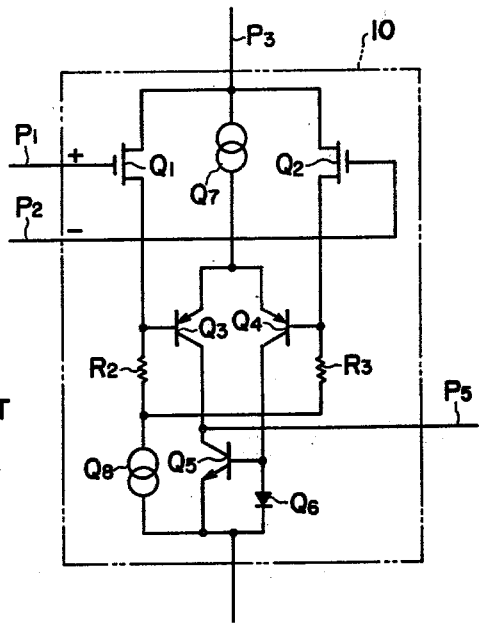
FIG. 5 is a circuit diagram showing one embodiment of the differential amplifier used in the photometric amplifier used in the photometric amplifier circuit constructed according to the present invention.

In FIG. 5, reference characters $Q_1$ and $Q_2$ indicate a pair of insulated gate field-effect transistors (MOSFETs) connected in differential form. $R_2$ and $R_3$ indicate the load resistors of the transistors MOSFETs $Q_1$ and $Q_2$, respectively. $Q_8$ is a constant current element for limiting the drain currents of the transistors $Q_1$ and $Q_2$. $Q_3$ and $Q_4$ are a pair of PNP transistors connected in differential form. $Q_7$ is a constant current element for limiting the emitter currents of the transistors $Q_3$ and $Q_4$, respectively. $Q_5$ is an NPN transistor. $Q_6$ is a PN junction diode. The transistors $Q_5$ and $Q_6$ form a current mirror circuit.

Referring back to FIG. 4, reference characters Rf indicate a negative feedback resistor which forms a negative feedback circuit together with a resistor Rs connected between the inverting input terminal $P_2$ of the differential amplifier 10 and ground. PC indicates a photodiode having a PN junction, using a semiconductor such as silicon, gallium, arsenide, gallium arsenide phosphide, etc. This photodiode is connected between the pair of input terminals of the differential amplifier 10. LD is a PN junction diode composed of a silicon semiconductor and connected in series with the photodiode PC, for logarithmically compressing the photocurrent of the photodiode with respect to the quantity of light. Reference numeral 20 indicates a standard voltage generating circuit for applying a standard voltage of one terminal of the logarithmic compressing diode LD, and 30 a power supply for supplying an operating voltage to the differential amplifier 10 and standard voltage generating circuit 20. S is a power switch such as a release button of a camera to supply electrical power to the differential amplifier when desiring the photometry. BD is a PN junction diode of semiconductor material such as silicon, inserted to clamp the voltage at the noninverting input terminal $P_1$ of the differential amplifier 10 substantially to the voltage equal to the standard voltage Vr when the switch S is closed. This diode BD is inserted in parallel with the logarithmic compressing diode LD but is connected so that the polarity is oppositely oriented. $R_1$ and $C_1$ form a differentiating circuit, which supplies the voltage higher than that at the noninverting input terminal $P_1$ of the differential amplifier 10 to the inverting input terminal $P_2$ of the differential amplifier 10 in the transient state when the power switch S is closed.

The operation of the above photometric amplifier circuit thus constructed will now be described. The noninverting input voltage Vs of the differential amplifier 10 can be obtained by the following equation in the normal operating state after the power voltage is applied thereto.

$$Vs = Vr - Vf (Ip)$$

where Vr represents the standard constant voltage generated from the standard voltage generating circuit 20, and Vf (Ip) is the forward voltage of the diode LD determined by the current (Ip) flowing according to the quantity of light received by the photodiode PC. The above current Ip is the photocurrent of the silicon photodiode PC, varying in response to the quantity of light. Since the forward voltage Vf of the diode LD, varying in response to the current Ip changes logarithmically, the photometric value can be converted to a logarithmic value.

When the silicon photodiode PC is connected between the input terminals of the negative feedback differential amplifier 10, the bias voltage of the photodiode PC is set to zero to thereby obtain the photocurrent varying rectilinearly in response to the received quantity of light.

The voltage substantially equal to the power voltage Vcc is applied to the inverting input terminal $P_2$ (−) instantaneously when the power switch S is closed, by the differentiating circuit composed of the resistor $R_1$ and capacitor $C_1$ connected to the differential amplifier 10 in the transient state when the power voltage is applied thereto. Thus, the voltage substantially equal to that applied to the noninverting input terminal $P_1$ (+) of the differential amplifier 10 in the transient state, or higher voltage is applied to the inverting input terminal of the differential amplifier 10 to prevent the potential from producing at both terminals of the photodiode Pc. As a result, no charge is accumulated at the junction capacity of the photodiode PC. Even if the voltage transiently supplied to the inverting input terminal via the differentiating circuit is higher than the transient voltage of the noninverting input terminal of the differential amplifier, it is so controlled as to be balanced with the voltage of the noninverting input terminal via the negative feedback circuit (Rf, Rs) connected to the inverting input terminal of the differential amplifier 10 to thereby prevent the charge from accumulating as described above. Further, if the back diode BD is connected in parallel with the logarithmic compressing diode LD in the embodiment, the voltage at the noninverting input terminal is clamped by the output standard voltage Vr of the standard voltage generating circuit 20, supplied through the back diode BD, even if the transient voltage of the noninverting input terminal $P_1$ tends to become abnormally high. In addition, since high voltage is supplied to the inverting input terminal P₂ of the differential amplifier 10, the accumulated charge at the junction capacity of the photodiode PC is forcibly discharged via the back diode BD. Thus, according to the present invention, since the voltage at both terminals of the photodiode PC connected between the input terminals, of a pair, of the differential amplifier 10 can be set to zero simultaneously when the power switch S is closed, the latch-up phenomenon of the output of the photometric amplifier circuit can be prevented.

Figure 6:
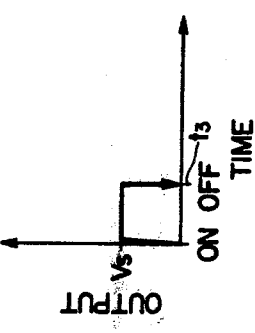
FIG. 6 is an electric characteristic chart showing the relationship between the time and the output of the circuit shown in FIG. 4.

FIG. 6 shows a characteristic chart of the photometric amplifier circuit according to the present invention. As obvious from this chart, it can obtain the output voltage Vs corresponding to the low quantity of light substantially simultaneously when the power is applied thereto to enable completing the photometric operation for the time upto the time $t_3$ when the power is shut off.

Figure 7:
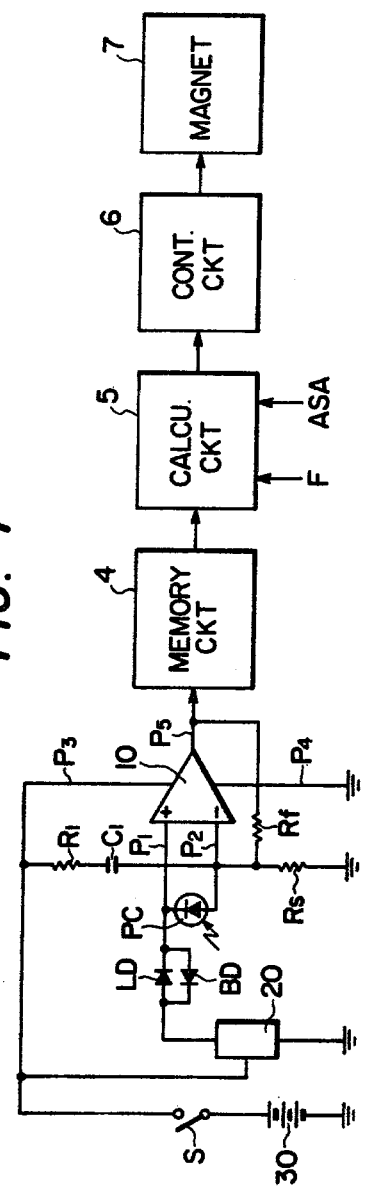
FIG. 7 is a block diagram of the photometric amplifier circuit of the present invention used for an automatic exposure control system for cameras.

FIG. 7 shows a block diagram of the photometric amplifier circuit described above, used for an automatic exposure control system for cameras.

In FIG. 7, the output of the photometric amplifier circuit is stored in a memory circuit 4, and the output of the memory circuit 4 is then applied to a calculating circuit 5. This calculating circuit 5 calculates an electric signal ASA for representing a film sensitivity applied in advance and an electric signal F for indicating the aperture metering value of the camera together with the photometric value to thus calculate a suitable exposure time and to then produce an output signal corresponding to the calculated exposure time. The output signal of the calculating circuit 5 is applied to a control circuit 6, which thereupon controls a magnet 7 for driving a shutter of the camera to provide a proper exposure time for the camera. The advantages of the present invention to be applied for this system are such that, when the power switch S is closed in cooperation with the release button of the camera, the photometric amplifier circuit of the present invention immediately photometers the illumination and determines the exposure time to extremely shorten the stand-by time until the shutter button is pressed and to thereby improve the performance of the camera.

It is to be noted that, in the above embodiment of the present invention, the voltage to be applied to the inverting input of the differential amplifier 10 via the differentiating circuit may preferably be the power voltage Vcc, and must be at least any higher than the transient voltage applied to the noninverting input terminal of the differential amplifier 10.

The present invention may also be broadly applied to the photometric circuit in addition to the camera.

What is claimed is:

1. A photometric amplifier circuit for amplifying an electric signal in response to a quantity of light, comprising:
    a differential amplifier having inverting and noninverting input terminals, and an output terminal;
    a photoelectric converting element for converting the quantity of light to an electric signal, said element being connected between the inverting and noninverting input terminals of said differential amplifier;
    closed circuit means provided to form a closed circuit across said photoelectric converting element, to permit the flow of the converted electric signal of said converting element;
    a power supply for energizing said differential amplifier, wherein the power voltage is supplied via a power switch to said differential amplifier;
    a negative feedback circuit including a first impedance means connected between the output terminal and inverting input terminal of said differential amplifier and a second impedance means connected between a reference potential source and the inverting input terminal of said differential amplifier; and
    voltage supplying means, connected to the inverting input terminal of said differential amplifier, for supplying a voltage to the inverting input terminal of said differential amplifier transiently when said power switch is closed to prevent the build-up of accumulated charge in the photoelectric converting element.

2. A photometric amplifier circuit as claimed in claim 1, wherein said photoelectric converting element comprises a photocell element composed of a PN junction semiconductor, and said closed circuit means comprises a semiconductor diode for logarithmically compressing the photocurrent of said photocell element.

3. A photometric amplifier circuit as claimed either claim 1 or 2, wherein said voltage supplying means comprises a differentiating circuit connected via said power switch between the inverting input terminal of said differential amplifier and said power supply.

4. A camera circuit comprising a photometric amplifier circuit for converting a quantity of light to an electric signal and amplifying the electric signal, a calculating circuit for calculating the exposure time of said camera upon reception of the output signal from said photometric amplifier circuit together with other control signals, and a control circuit for controlling the exposure time of said camera according to the output of said calculating circuit, said photometric amplifier circuit comprising:
    means for coupling a first voltage terminal for supplying a first predetermined voltage to a noninverting input terminal of a differential amplifier;
    a photo-current converting element provided between the noninverting and inverting input terminals of said differential amplifier;
    a feedback circuit including a first impedance means provided between the output and inverting input terminals of said differential amplifier and a second impedance means provided between a reference potential source and the inverting input terminal of said differential amplifier; and
    a differentiating circuit provided between a second voltage terminal for applying a second predetermined voltage and the inverting input terminal of said differential amplifier to prevent the build-up of accumulated charge in the photoelectric converting element when a power switch coupling the second voltage terminal and the inverting input terminal of the differential amplifier is closed.

5. A circuit according to claim 4, wherein said second voltage terminal is also coupled to energize the differential amplifier through the switch.

6. A circuit according to claim 4, wherein the means for coupling the first voltage terminal to the noninverting input terminal is a diode.

7. A circuit according to claim 1 or 4, wherein said voltage applied to the inverting terminal of the differential amplifier when the power switch is closed is substantially equal to the voltage at the noninverting terminal of the differential amplifier at the time the power switch is closed.

8. A circuit according to claim 1 or 4, wherein said voltage applied to the inverting terminal of the differential amplifier when the power switch is closed is greater than the voltage at the noninverting terminal at the time the power switch is closed.

9. A circuit according to claim 8, wherein the photoelectric converting element is a photodiode having its anode coupled to the inverting terminal of the differential amplifier and its cathode coupled to the noninverting input, further comprising a discharge path coupled to the cathode of the photodiode so that any accumulated charge on the photodiode will be discharged through the discharge path when the voltage is applied to the inverting terminal when the power switch is closed.

10. A circuit according to claim 1 or 4, wherein the first and second impedance means are resistors.

* * * * *